US006791840B2

(12) United States Patent
Chun

(10) Patent No.: US 6,791,840 B2

(45) Date of Patent: Sep. 14, 2004

(54) INCANDESCENT TUBE BULB REPLACEMENT ASSEMBLY

(76) Inventor: James K. Chun, 7178 NE. William Rd., Indianola, WA (US) 98342

( * ) Notice: Subject to any disclaimer, the term of this patent is extended or adjusted under 35 U.S.C. 154(b) by 0 days.

(21) Appl. No.: 10/345,996

(22) Filed: Jan. 17, 2003

(65) Prior Publication Data

US 2004/0141293 A1 Jul. 22, 2004

(51) Int. Cl.[7] .................................................. H05K 7/20

(52) U.S. Cl. ....................... 361/715; 361/752; 361/760; 361/796; 313/113; 313/116; 362/236; 362/800

(58) Field of Search ................................ 361/715, 752, 361/796, 806, 760, 748, 761; 313/113, 116; 362/236, 800, 341

(56) References Cited

U.S. PATENT DOCUMENTS

| | | | | | |
|---|---|---|---|---|---|
| 5,567,036 | A | * | 10/1996 | Theobald et al. | 362/485 |
| 5,580,156 | A | * | 12/1996 | Suzuki et al. | 362/184 |
| 5,947,588 | A | | 9/1999 | Huang | 362/235 |
| 6,036,336 | A | * | 3/2000 | Wu | 362/249 |
| 6,276,822 | B1 | | 8/2001 | Bedrosian et al. | 362/545 |
| 6,335,864 | B1 | * | 1/2002 | Klubenspies | 361/760 |
| 6,367,949 | B1 | | 4/2002 | Pederson | 362/240 |
| 6,554,452 | B1 | * | 4/2003 | Bourn et al. | 362/247 |
| 6,573,653 | B1 | * | 6/2003 | Ishinaga | 313/512 |
| 6,595,656 | B2 | * | 7/2003 | Yoda | 362/187 |
| 2003/0151917 | A1 | * | 8/2003 | Daughtry et al. | 362/231 |

* cited by examiner

*Primary Examiner*—David A. Zarneke
*Assistant Examiner*—Thanh Y. Tran
(74) *Attorney, Agent, or Firm*—Dean A. Craine

(57) ABSTRACT

An incandescent tube bulb replacement assembly that is used in place of a horizontal incandescent tube light in a standard interior horizontal tube light fixture. The assembly includes a small printed circuit board (PCB) with a plurality of LEDs mounted perpendicularly thereon. During installation, the existing horizontal incandescent tube is removed and replaced with an LED assembly so that the LEDs fit into the center of the reflector. Attached to the opposite sides of the PCB are two, upward extending conductor arms that snap-fit into the two existing end conductors. The PCB includes a lighting circuit that allows the assembly to connect without regard to the polarity.

5 Claims, 4 Drawing Sheets

INCANDESCENT TUBE BULB REPLACEMENT ASSEMBLY

BACKGROUND OF THE INVENTION

1. Field of the Invention

The present invention relates to incandescent tube light bulb assemblies and, more particularly, to such assemblies which hold a replacement incandescent tube light bulb between two tube end conductors.

2. Description of the Related Art

Boats and recreational vehicles often have mounted internal lights that use a replaceable incandescent tube bulb mounted at its ends between two tube end conductors. Such lights use a substantial amount of electrical energy in a relatively short time which discharges the storage batteries connected thereto.

Because these internal lights include outer housing or covers that are built into the cabinet or ceiling of the boat or vehicle, light assemblies that use light emitting diodes that use less electric energy and can be used in place of the incandescent tube bulb would be highly desirable.

SUMMARY OF THE INVENTION

It is an object of the present invention to provide a replacement light assembly designed to be used in place of an incandescent tube bulb that uses less electrical energy than the incandescent tube bulb.

It is an object of the present invention to provide such an invention that can be used in the existing outer housing, reflector, electrical connectors, and lens cover.

These and other objects of the present invention are met by an incandescent tube bulb replacement assembly that includes a plurality of light emitting diodes (LEDs) mounted onto a printed circuit board (PCB) with connectors designed to engage the existing electrical end connectors used in the incandescent light tube housing. During installation, the existing incandescent tube bulb is removed from the housing and replaced with the incandescent tube bulb replacement assembly disclosed herein. The PCB is positioned inside the housing and the LEDs are inserted into the center hole formed on an optional reflector. The two existing end conductors used inside the housing extend upward, adjacent to the reflector. Attached to the opposite sides of the PCB are two upward extending conductor arms that, during assembly, snap-fit into the two existing end conductors mounted inside the housing. Insulators are disposed around the two conductor arms to prevent contact with the reflector. In the preferred embodiment, the PCB includes a bridge rectifier that enables the conductor arms may be mounted in any direction between the two end conductors.

DESCRIPTION OF THE PREFERRED EMBODIMENT(S)

Figure 1:
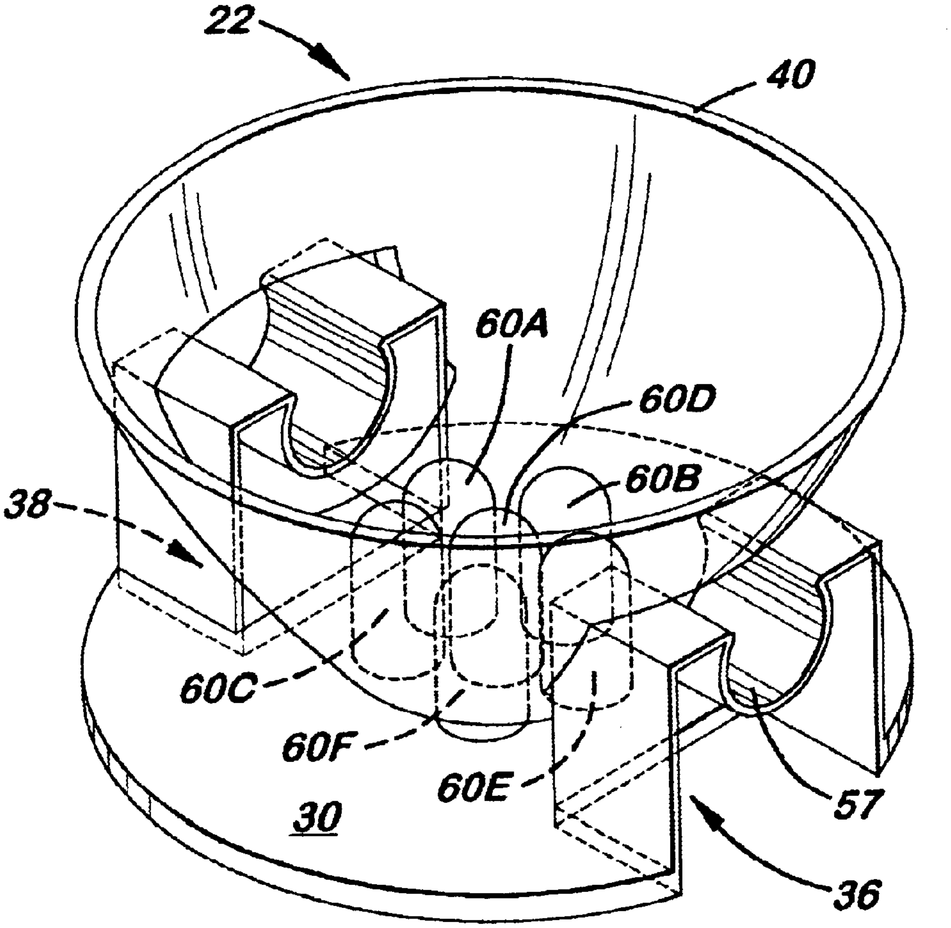
FIG. 1 is perspective view of the incandescent tube light replacement assembly disclosed herein.
Figure 2:
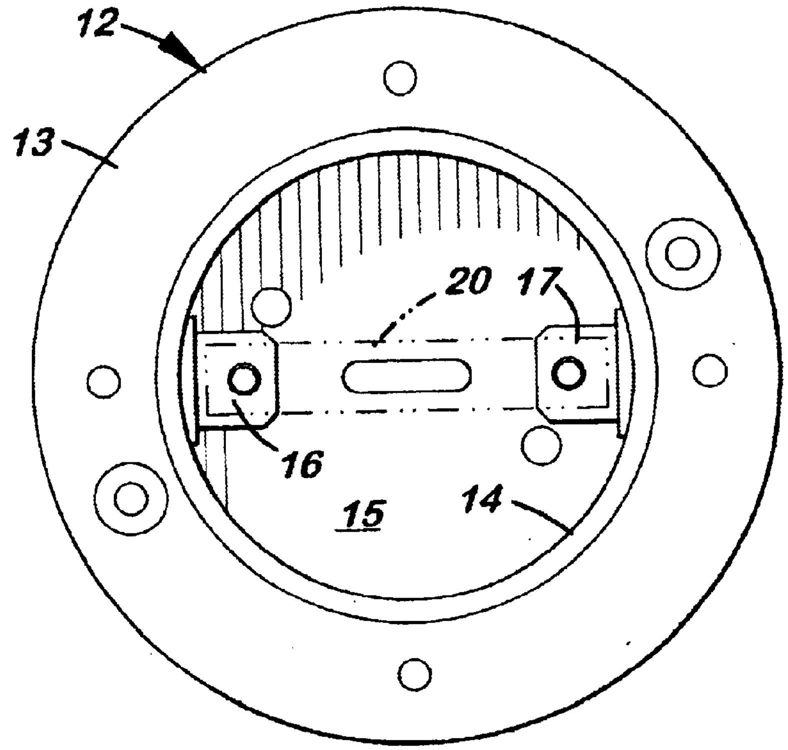
FIG. 2 is a side elevational view of the invention.
Figure 3:
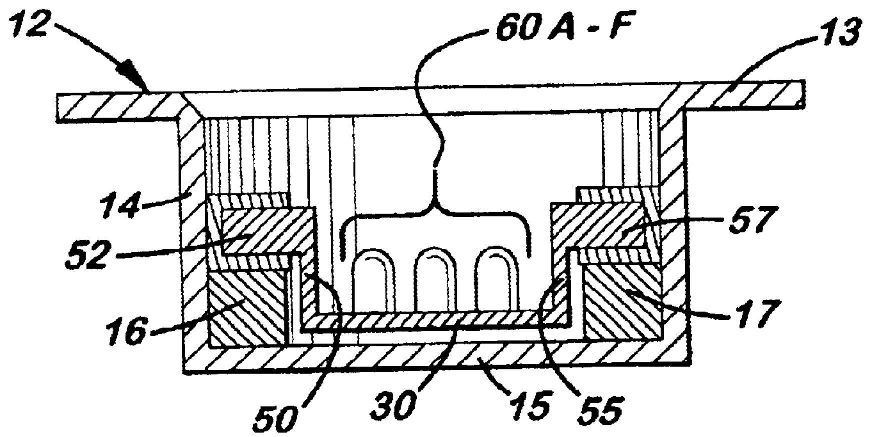
FIG. 3 is a top plan view of an existing incandescent tube light found in the prior art
Figure 4:
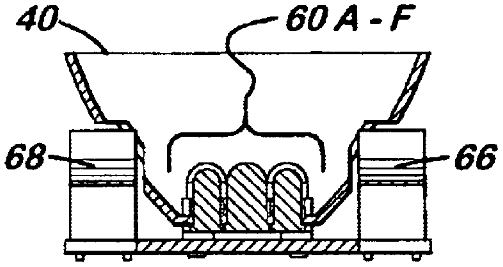
FIG. 4 is a sectional side elevational view of the invention.
Figure 5:
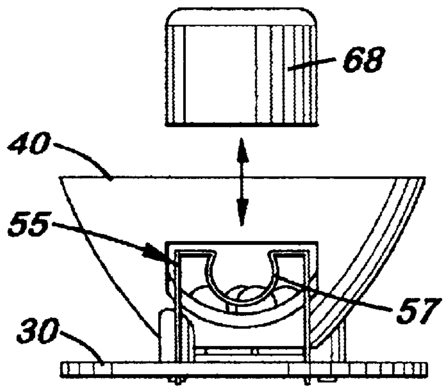
FIG. 5 is an end elevational view of the invention.
Figure 6:
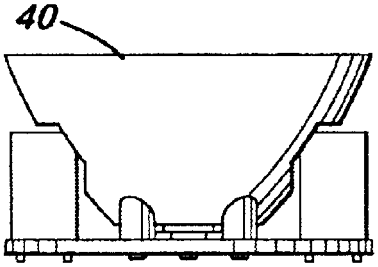
FIG. 6 is a side elevational view of the invention.
Figure 7:
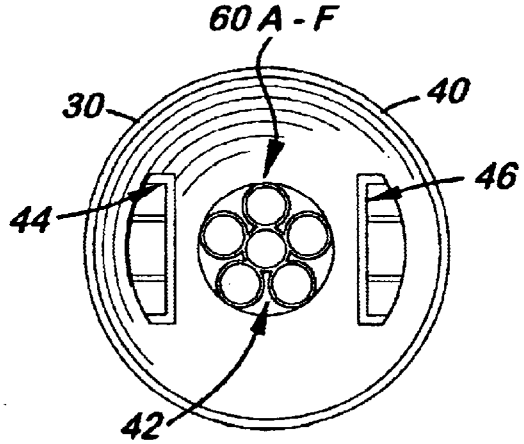
FIG. 7 is a top plan view of the invention.

There is shown and described in the accompanying FIGS. 1, 3–7 an incandescent tube bulb replacement assembly 22 that replaces the incandescent tube 20 used in the outer housing 12 shown in FIG. 2 which are commonly used in recreational motor vehicles or boats. The outer housing 12 includes an upper flat flange surface 13 with a perpendicularly mounted cylinder 14 mounted thereon. The cylinder 14 includes a flat interior surface 15 with two upward extended end connectors 16, 17 mounted thereon that hold the end of an incandescent tube 20.

The replacement assembly 22 includes a plurality of light emitting diodes (LEDs) 60 A–E perpendicularly mounted on a small printed circuit board 30, hereinafter referred to as PCB 30. The overall shape of the PCB 30 is circular and sufficient in size to allow the PCB 30 to fit over the interior surface 15 and inside the outer housing 12. Slots 36, 38 are formed in the PCB 30 that allow the PCB 30 to fit around the two end connectors 16, 17. The LEDs 60 A–E are centrally mounted on the PCB 30 and extend upward inside the existing outer housing 12 along its central axis. The replacement assembly 22 may include an optional reflector 45 that is aligned perpendicularly over the PCB 30. Formed on the reflector 40 is a center hole 42 through which the LEDs 60A–E extend. The reflector 40 also includes two side slots 44, 46 designed to receive the two extension arms 50, 55 mounted on the PCB 30.

The two extension arms 50, 55 are mounted near the opposite sides of the PCB 30. Attached or formed on the upper end of each extension arm 50, 55 is a semi-circular adaptor 52, 57, respectively, designed to snap-fit into the existing end connectors 16, 17 located inside the outer housing 12. The extension arms 50, 55 are sufficiently spaced apart and are sufficient length so that when the PCB 30 and LEDs 60 A–E are positioned inside the outer housing, the adaptors 52, 57 snap-fit into the end connectors 16, 17.

Also provided are a pair of optional inverted U-shaped insulators 66, 68 designed to cover each extension arm 50, 55 to prevent the reflector 40 from contacting the adaptors 52, 57 or the extending arms 50, 55.

Figure 8:
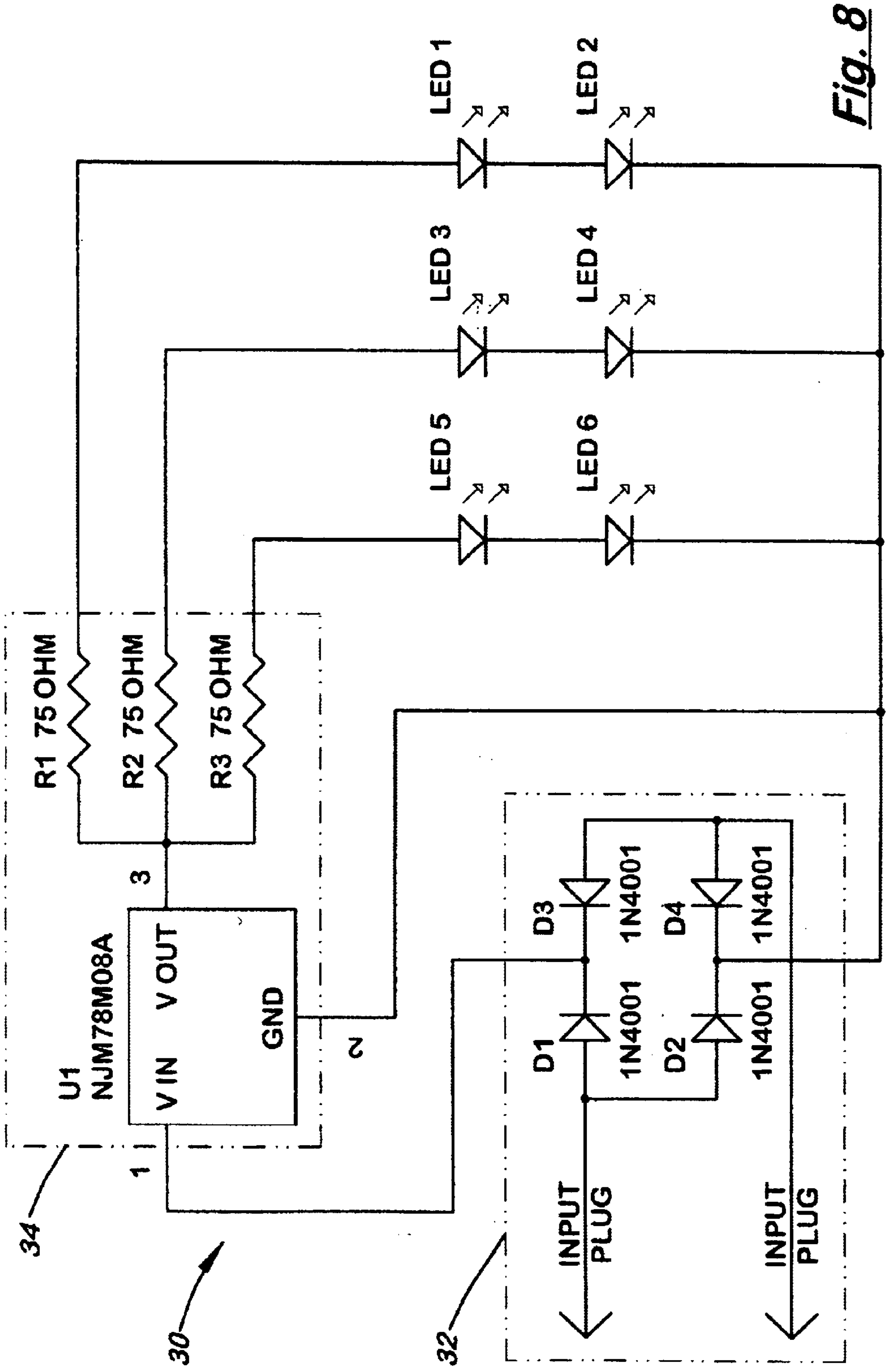
FIG. 8 is a schematic view of the printed circuit board.

FIG. 8 is a schematic of the PCB 30. Located on the PCB 30 is a bridge rectifier 32 that enables the extension arms 50, 55 to be mounted in any position between the two existing end connectors 16, 17. The PCB 30 also includes a voltage regulator 34 that boosts the voltage from the electrical power source to approximately 5.0 volts required for the six LEDs 60A–E.

During installation, the existing incandescent tube bulb is removed from the existing light outer housing. The LEDs 60 A–E and PCB 30 are then selected and aligned on the reflector 40 so that the LEDs 60 A–E extend through the center hole 42. When properly positioned, the two insulators 66, 68 extend through side slots 44, 46 formed on the reflector 40. The PCB 30 and reflector 40 are then pressed downward into the outer housing 12 so that the adaptors 52, 57, on the end connectors 16, 17, respectively, engage the two upward extension arms 50, 55.

In compliance with the statute, the invention described herein has been described in language more or less specific as to structural features. It should be understood, however, that the invention is not limited to the specific features shown, since the means and construction shown, is comprised only of the preferred embodiments for putting the invention into effect. The invention is therefore claimed in any of its forms or modifications within the legitimate and valid scope of the amended claims, appropriately interpreted in accordance with the doctrine of equivalents.

What is claimed is:

1. An incandescent tube bulb replacement assembly, comprising:

a. an outer housing used with an incandescent light assembly, said outer housing including an interior surface;

b. two upward extending end connectors located inside said outer housing capable of holding an incandescent tube at its opposite ends;

c. a printed circuit board capable of being disposed inside said outer housing, said printed circuit board including a pair of slots that allow said extending end connectors to extend through said printed circuit board when said printed circuit board is placed inside said outer housing and over said interior surface;

d. a plurality of LEDs mounted centrally on said top surface of said printed circuit board; and, e. two upward extension arms mounted on said printed circuit board, each said extension arm being sufficient in length and including an adaptor that fits into one said upward extending end connector to electrically connect said printed circuit board to said end connectors.

2. The replacement assembly, as recited in claim 1, wherein each said extension arm includes an adaptor that snap-fits into said end connectors.

3. The replacement assembly, as recited in claim 1, further including a reflector with a center hole through which said LEDs extend.

4. The replacement assembly, as recited in claim 2, further including a pair of insulators located around said extension arms to prevent electrical shorts with said reflector.

5. The replacement assembly, as recited in claim 2, further including a bridge recited circuit on said printed circuit board.

* * * * *